United States Patent [19]
Kojima et al.

[11] Patent Number: 5,766,498
[45] Date of Patent: Jun. 16, 1998

[54] ANISOTROPIC ETCHING METHOD AND APPARATUS

[75] Inventors: Masayuki Kojima, Kokubunji; Yoshikazu Ito, Yamanashi-ken; Kazushi Tomita, Kawaguchi; Shigeki Tozawa, Nirasaki; Shunichi Iimuro, Yamanashi-ken; Masashi Arasawa, Enzan; Eiichi Nishimura, Yamanashi-ken, all of Japan

[73] Assignees: Hitachi, Ltd.; Tokyo Electron Limited, both of Tokyo; Tokyo Electron Yamanashi Limited, Nirasaki, all of Japan

[21] Appl. No.: 623,737

[22] Filed: Mar. 29, 1996

Related U.S. Application Data

[62] Division of Ser. No. 473,777, Jun. 5, 1995, abandoned, which is a division of Ser. No. 154,566, Nov. 19, 1993, Pat. No. 5,445,709.

[30] Foreign Application Priority Data

Nov. 19, 1992 [JP] Japan .................... 4-310279

[51] Int. Cl.$^6$ ........................................ H01L 21/302
[52] U.S. Cl. ............................ 216/71; 156/345
[58] Field of Search .................. 156/345, 643.1; 118/725; 204/298.33, 298.07; 216/71

[56] References Cited

U.S. PATENT DOCUMENTS

| | | | |
|---|---|---|---|
| 4,561,907 | 12/1985 | Raicu | 156/643 |
| 4,908,095 | 3/1990 | Kagatsume et al. | 156/345 |
| 4,931,135 | 6/1990 | Horiuchi et al. | 156/345 |
| 5,013,400 | 5/1991 | Kurasaki et al. | 156/345 |
| 5,074,456 | 12/1991 | Degner et al. | 156/345 |
| 5,314,573 | 5/1994 | Higuchi et al. | 156/643 |
| 5,445,709 | 8/1995 | Kojima et al. | 216/71 |

FOREIGN PATENT DOCUMENTS

| | | |
|---|---|---|
| 60-171728 | 9/1985 | Japan. |
| 61-174721 | 8/1986 | Japan. |
| 63-169729 | 7/1988 | Japan. |
| 3-245526 | 11/1991 | Japan. |

*Primary Examiner*—Robert Kunemund
*Assistant Examiner*—George Goudreau
*Attorney, Agent, or Firm*—Oblon, Spivak, McClelland, Maier & Neustadt, P.C.

[57] ABSTRACT

A parallel-plate plasma etching apparatus includes a susceptor electrode and a shower electrode which are arranged in a process chamber. A semiconductor wafer is placed on the susceptor electrode. A shower region defined by a plurality of process gas supply holes is formed in the shower electrode. The shower electrode is cooled by a cooling block and causes an effective electrode portion of the shower electrode to have a temperature gradient such that a temperature at the central portion of the effective electrode portion is lower than a temperature at the peripheral portion of the effective electrode portion. The diameter of the shower region is selected to be smaller than the diameter of the wafer by 5 to 25% such that degradation of planar uniformity of a degree of etching anisotropy on the wafer caused by the temperature gradient of the effective electrode portion is compensated for. The diameter of the effective electrode portion is selected to be larger than the size of a wafer by 5 to 35% such that a taper angle of a side wall to be etched formed by etching is set to be 85° to 90°.

23 Claims, 5 Drawing Sheets

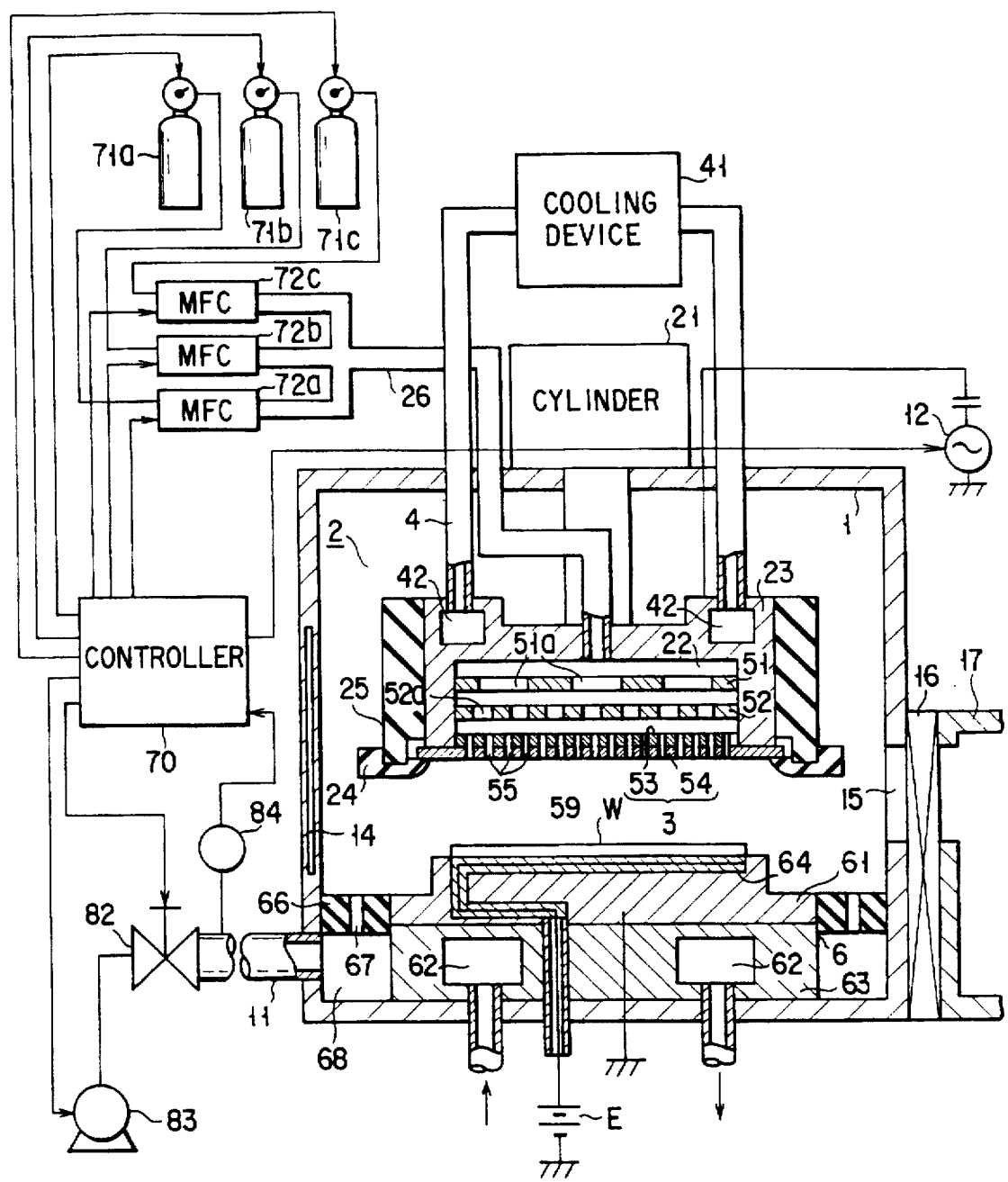
F I G. 1

ANISOTROPIC ETCHING METHOD AND APPARATUS

This application is a Division of application Ser. No. 08/473,777, filed on Jun. 5, 1995, now abandoned, which is a Division of application Ser. No. 08/154,566, filed on Nov. 19, 1993, now Pat. No. 5,445,709.

BACKGROUND OF THE INVENTION

1. Field of the Invention

The present invention relates to an anisotropic etching method and apparatus, such as a method and apparatus for forming contact holes in the process of manufacturing semiconductor devices.

2. Description of the Related Art

In the manufacturing process of a semiconductor device or an LCD, anisotropic etching is performed to form a pattern on a substrate itself or on a thin film on the substrate. For example, when contact holes are to be formed in an $SiO_2$ film formed on an Si wafer, i.e., a substrate, processing is performed in the following rough process order. A photoresist is coated on an $SiO_2$ film to form a resist film. The resist film is exposed using an exposure mask having a predetermined pattern. The exposed resist film is developed to leave the patterned resist film. The $SiO_2$ film is anisotropically etched using the patterned resist film as a mask.

This anisotropic etching is generally performed as dry etching using an active gas plasma at a reduced pressure. As one of apparatuses for performing the etching as described above, a parallel-plate type plasma etching apparatus is known. This apparatus comprises two opposing electrodes arranged in a process chamber. A target substrate is generally placed on the lower electrode, and an RF power supply is connected to the upper electrode. A parallel-plate type plasma etching apparatus having a structure in which the upper electrode is used as a header for supplying a process gas is also known, as shown in unexamined Japanese Patent Application No. 61-174721. In this structure, a large number of gas supply holes are formed in the lower surface of the upper electrode, and the process gas is showered on a target substrate.

In the plasma etching apparatus in No. 61-174721, a radius R of a hole forming region on the upper electrode is specified by an equation: $R = -AG + R0$, where R0 is the radius of a target substrate (wafer), G is the distance between the electrodes, and A is a constant. This equation is determined to improve planar uniformity of etch rates on a target substrate. This publication describes the following. As shown in FIG. 3, when the radius R is larger than the value specified by this equation, the etch rate of the peripheral portion of the wafer is higher than the etch rate of the central portion of the wafer; when the radius is smaller than the value, the etch rate of the central portion of the wafer is higher than the etch rate of the peripheral portion of the wafer. In short, since a rate of supplying the process gas to the periphery of the wafer is higher as the radius R is larger, the etch rate of the peripheral portion of the wafer is higher, and the etch rate is lower as the radius R is smaller.

As shown in U.S. Pat. No. 4,908,095 (issued on 1990, Mar. 13), a structure for cooling a shower type upper electrode is proposed. Although the details of the structure are to be described in the detailed description of the preferred embodiment, cooling of the upper electrode enhances an effect of decreasing a deposition amount of reaction products on a target substrate. However, in extensive studies on apparatuses of this type, several items to be considered have been found out.

The first item is planar uniformity of a degree of etching anisotropy on a target substrate. That is, degrees of etching anisotropy of the central and peripheral portions of the target substrate tend to be different from each other. Therefore, for example, when contact holes are formed at the central and peripheral portions of the wafer, the inclination angles or taper angles of the side walls of the contact holes are different from each other.

The second item is the inclination angle of a side wall, e.g., a contact hole wall surface, of an object to be etched formed by the anisotropic etching. This angle which is close to almost 90° is an important factor for obtaining high-quality products.

SUMMARY OF THE INVENTION

It is, therefore, an object of the present invention to improve planar uniformity of a degree of etching anisotropy on a target substrate.

It is another object of the present invention to cause a side wall to be etched formed by anisotropic etching to be close to a vertical line.

According to the invention an anisotropically etching method uses a plasma etching apparatus including a process chamber, a first electrode arranged in the process chamber, the first electrode having a support portion for supporting a substrate to be processed, a second electrode arranged in the process chamber, the second electrode having an opposing portion opposite to the support portion of the first electrode, a power supply for applying an RF voltage across the first and second electrodes, exhausting means for exhausting the process chamber, supplying means for supplying a process gas into the process chamber, the supplying means having a shower region defined by a plurality of holes formed in the opposing portion of the second electrode, and the process gas being supplied onto the substrate supported by the first electrode through the holes, and cooling means for cooling the second electrode having the opposing portion whose temperature gradient is defined such that a temperature at a peripheral portion of the opposing portion is lower than a temperature at a central portion of the opposing portion, the method comprising:

selecting a size of the shower region, the size of the shower region being selected to be smaller than a size of the substrate such that degradation of planar uniformity of a degree of etching anisotropy on the substrate caused by the temperature gradient of the opposing portion is compensated for;

selecting a size of the opposing portion, the size of the opposing portion being selected to be larger than a size of the substrate such that a taper angle of a side wall formed by etching is set to be 85° to 90°;

setting the apparatus on the basis of the selected sizes of the shower region and the opposing portion, the centers of the shower region and the opposing region being arranged to be substantially aligned with the center of the substrate when the substrate is supported by the first electrode;

arranging the substrate on the support portion of the first electrode;

exhausting the process chamber;

supplying the process gas through the holes of the shower region;

applying an RF voltage from the power supply across the first and second electrodes to make the process gas into a plasma; and anisotropically etching the substrate using the plasma.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention, in which:

FIG. 1 is sectional view showing a part of a plasma etching apparatus according to an embodiment of the present invention;

DETAILED DESCRIPTION OF THE PREFERRED EMBODIMENTS

Figure 2:
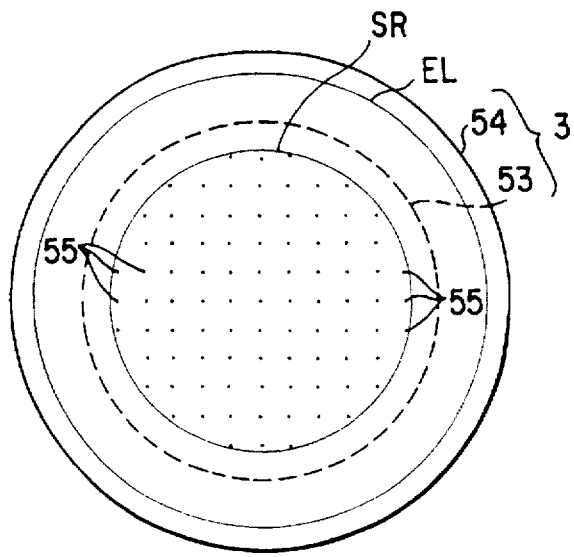
FIG. 2 is a bottom view showing a shower electrode of the apparatus shown in FIG. 1.

FIG. 1 is a schematic view showing an overall plasma etching apparatus for a semiconductor wafer according to an embodiment of the present invention. A process chamber 1 is constituted by an aluminum wall having an anodic oxide surface, and the interior of the process chamber 1 is kept airtight. An electrode unit 2 is arranged at the upper portion in the process chamber 1. The electrode unit 2 is vertically movably supported by a rod of a vertical drive cylinder 21.

A shield ring 25 is fitted on the electrode unit 2, and a cooling block 23 is stored in the shield ring 25. The shield ring 25 consists of an insulator. An internal path 42 is formed in the cooling block 23, and a coolant is circulated from a cooling device 41 into the internal path 42.

Baffle plates 51 and 52 are arranged in the recessed portion of the cooling block 23. Each of the cooling block 23 and the first and second baffle plates 51 and 52 is constituted by an aluminum plate or an aluminum alloy plate having an anodic oxide surface. A shower electrode 3 serving as an upper electrode is detachably arranged at the lower end portion of the cooling block 23. The peripheral portion of the shower electrode 3 is pressed against the cooling block 23 by an insulating ring 24.

The shower electrode 3 is formed by combining a cathode plate 54 and a cooling plate 53, and the plates 53 and 54 are adhered to each other. The cathode plate 54 is constituted by a disk having a thickness of 4 mm and consisting of amorphous carbon. The cooling plate 53 is constituted by an aluminum or aluminum alloy disk having an anodic oxide surface. The shower electrode 3 is electrically connected to an RF power supply 12 having a frequency of 400 kHz and a power of 1,300 W, and a susceptor electrode 61 serving as the lower electrode is grounded. Therefore, a plasma generation circuit is formed by the shower electrode 3 and the lower susceptor electrode 61.

The baffle plate 52 is arranged above the shower electrode 3, the baffle plate 51 is arranged above the baffle plate 52, and the gas supply port of a pipe 26 is arranged above the baffle plate 51. The shower electrode 3 and the baffle plates 51 and 52 are substantially horizontally arranged and parallel to each other. A gas feed chamber 22 is formed by the baffle plate 51 and the cooling block 23. Vent holes 51a, 52a, and 55 are formed in the first and second baffle plates 51 and 52 and the shower electrode 3, respectively. The diameters of the vent holes 51a, 52a, and 55 are decreased in this order.

An end opening of the gas supply pipe 26 communicates with the upper central portion of the gas feed chamber 22. The proximal end side of the gas supply pipe 26 is branched into three parts, and the branched pipes communicate with gas supply sources 71a, 71b, and 71c through mass-flow controllers (MFCs) 72a, 72b, and 72c, respectively. Ar is stored in the gas supply source 71a, $CF_4$ is stored in the gas supply source 71b, and $CHF_3$ is stored in the gas supply source 71c. The gas supply sources 71a, 71b, and 71c have pressure adjustment valves, respectively, and a power supply for the actuators of the pressure adjustment valves is connected to the output of the controller 70. The MFCs 72a, 72b, and 72c can be controlled by the controller 70 independently of the gas supply sources 71a, 71b, and 71c. That is, while the pressures of the gas supply sources 71a, 71b, and 71c are controlled to be constant, the flow rates of the MFCs 72a, 72b, and 72c are controlled to be constant.

A wafer holding table 6 having the susceptor electrode 61 is arranged at the lower portion in the process chamber 1, and a wafer W can be placed on the susceptor electrode 61. The susceptor electrode 61 incorporates an electrostatic chuck 64 to which DC power is supplied from an external DC power supply E. The wafer holding table 61 is constituted by an aluminum or aluminum alloy plate having an anodic oxide surface. The shower electrode 3 is arranged at a level such that the interval between the shower electrode 3 and the susceptor electrode 61 is set to be about 8 mm to 15 mm during etching. The lower surface of the susceptor electrode 61 is in tight contact with a cooling block 63. The cooling block 63 has an internal path 62, and a coolant such as liquid nitrogen is supplied from a coolant source (not shown) into the internal path 62.

A clamp for pressing the wafer against the susceptor electrode 61 may be used in place of the electrostatic chuck 64. A clamp having a driving portion at its upper portion is disclosed in U.S. Pat. No. 4,908,095 (issued on 1990, Mar. 13), and a clamp having a driving portion at its lower portion is disclosed in co-pending U.S. Ser. No. 08/017,379 (filed on 1992, Feb. 12), the teachings of which are hereby incorporated by reference.

An exhaust ring 66 having 10-mm diameter exhaust holes 67 at angular intervals of 10° is arranged between the susceptor electrode 61 and the side wall of the process chamber 1. The exhaust ring 66 is arranged to constitute one continuous plane with the shoulder surface of the susceptor electrode 61. The exhaust ring 66 is formed to have a thickness of 10 to 20 mm and consists of an insulating material such as anodic aluminum, ceramic, Teflon, quartz, or sapphire to prevent discharge.

An exhaust pipe 11 is connected to a lower side wall portion of the process chamber 1. The exhaust pipe 11 communicates with a suction port of a vacuum pump 83. A valve 82 and a pressure sensor 84 are connected midway along the exhaust pipe 11. The pressure sensor 84 is connected to the input of the controller 70, and the operations of the valve 82 and the vacuum pump 83 can be controlled on the basis of a pressure detected by the pressure sensor 84.

Therefore, an exhaust region 68 separated from a plasma generation region 59 is constituted by the exhaust ring 66. In order to cause a plasma to stay in the plasma generation region 59, the plasma generation region 59 is separated such that the pressure difference is kept between the plasma generation region 59 having a pressure of 1 mTorr and the exhaust region 68 having a pressure of $10^{-1}$ mTorr. In addition, a plurality of, e.g., two, openings connected to the exhaust pipe 11 are formed to cause a gas to be uniformly exhausted. Therefore, an uniform process gas flow is formed in the plasma generation region 59.

An unloading port 15 for the wafer W is formed in the side wall of the process chamber 1. A load lock chamber 17 is connected to the unloading port 15 through a gate 16. A transfer arm (not shown) is arranged in the load lock chamber 17, and the wafer W is loaded/unloaded to/from the process chamber 1. Three vertically movable pins (not shown) which can be vertically moved through the electrostatic chuck 64 are arranged in the susceptor electrode 61. The transfer arm transfers/receives the wafer W to/from the susceptor electrode 61 with assistance of the vertically movable pins.

A plurality of ceramic heaters 14 which are formed in the form of electric wires are buried in the process chamber 1 at a portion corresponding to the plasma generation region 59. The heaters 14 are used to heat the side wall of the process chamber 1 to a temperature at which no reaction product is deposited.

Figure 3:
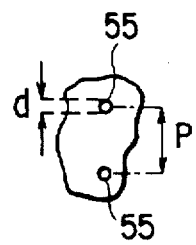
FIG. 3 is a view showing gas supply holes of the shower electrode shown in FIG. 2.
Figure 5:
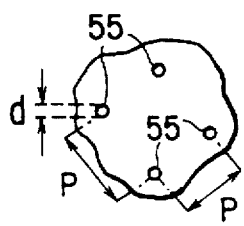
FIG. 5 is a view showing gas supply holes of the shower electrode shown in FIG. 4.
Figure 4:
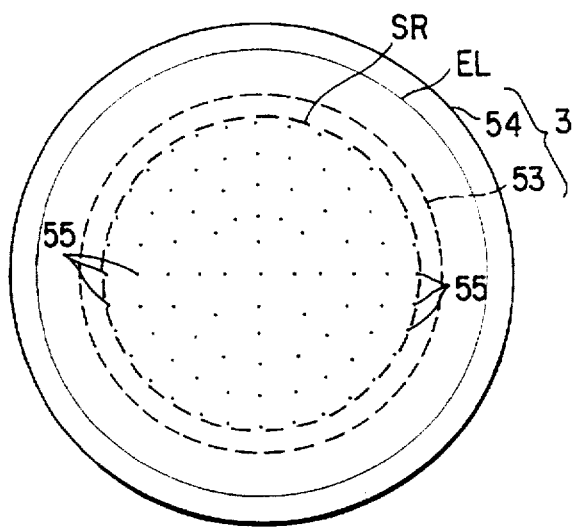
FIG. 4 is a bottom view showing a modification of the shower electrode.

As shown in FIGS. 2 and 4, the shower electrode 3 is coaxially covered with the insulating ring 24 to define a circular effective electrode portion EL. As shown in FIGS. 2 and 3, a shower region SR in which the large number of process gas supply holes 55 communicating with the gas feed chamber 22 are arranged in a matrix form is formed on the shower electrode 3. As shown in FIGS. 4 and 5, the holes 55 may be arranged in a radial form. In FIGS. 3 and 5, each of the holes 55 has a diameter d of 0.6 mm, and the holes 55 are arranged at an equal pitch P of 7 mm.

The shower region SR is a region surrounded by a line obtained by connecting the process gas supply holes 55 farthest from the center of the effective electrode portion EL in radial directions. The shower region SR is substantially circular, and is coaxially arranged with respect to the effective electrode portion EL. The wafer W is placed on the susceptor electrode 61 to be substantially coaxial with the effective electrode portion EL and the shower region SR.

In order to easily understand the present invention, the mechanism of anisotropic etching in the apparatus shown in FIG. 1 will be briefly described with reference to FIG. 6.

Figure 6:
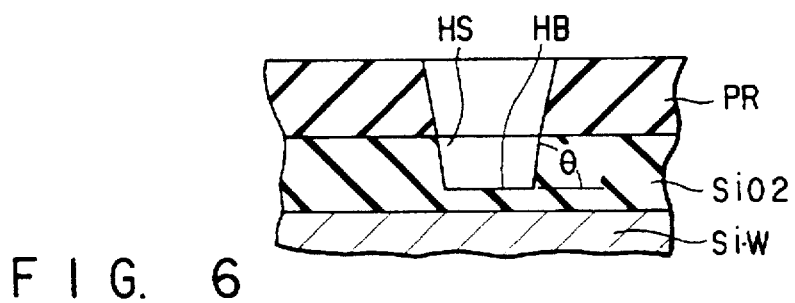
FIG. 6 is a sectional view showing the mechanism of anisotropic etching.

For example, as shown in FIG. 6, assume that a patterned photoresist film PR is used as a mask and that contact holes are formed in an $SiO_2$ film on the Si wafer W. A gas mixture of Ar, $CF_4$, and $CHF_3$ is supplied from the holes 55 of the shower electrode 3. This gas mixture is made into a plasma in the process chamber 1, and the $SiO_2$ film is etched using this plasma.

When the gas mixture is made into the plasma, ions such as $Ar^+$ and $H^+$ and active species or radicals such as $F^*$ and $CF^*$ are generated. The ions such as $Ar^+$ and $H^+$ are attracted by the potential of the susceptor electrode 61, and almost vertically collide with the $SiO_2$ film to physically etch the $SiO_2$ film. $F^*$ reacts with $SiO_2$ to produce volatile $SiF_4$, thereby chemically etching the $SiO_2$ film.

In contrast to this, $CF_2$ radicals react with each other to produce a fluorocarbon-based polymer, and the polymer falls and is deposited on the side wall HS and the bottom HB of each of the contact holes. The polymer film formed by deposition functions as a barrier for preventing $SiO_2$ from being in contact with $F^*$. However, at each of the hole bottoms HB, the polymer film is broken by collision with $Ar^+$ and $H^+$ ions, so that the hole bottom HB is subjected to a chemical etching operation caused by $F^*$ and a physical etching operation caused by ions. In this manner, anisotropic etching in which etching is preferentially performed in the vertical direction is performed.

When an Ar content in the gas mixture is increased, the side wall HS formed by etching is close to an almost vertical line. In addition, Ar also has a function of stabilizing discharge. However, in contrast to this, when the Ar content is increased, the selectivity ratio of $SiO_2$ to Si in etching is decreased. In addition, since Ar is expensive, running cost is increased.

A polymer is easily deposited at each of the hole bottoms. For this reason, when the polymer deposition amount is excessively large, etching of the hole bottom HB is avoided, and the taper angle i of the each of the etched side walls HS is increased disadvantageously. In order to decrease the polymer deposition amount, it is effective to cool the upper electrode or the shower electrode 3. This is because the produced fluorocarbon-based polymer is easily attracted by a low-temperature portion, and when the shower electrode 3 is cooled, the produced polymer is attracted by the electrode 3, and the polymer deposition amount on the wafer W is decreased.

However, the following fact was found out in the extensive studies by the present inventors. That is, when the shower electrode 3 was cooled, planar uniformity of a degree of etching anisotropy on the wafer was degraded. More specifically, when a conventional shower electrode was used without any change, it was found out that the side wall taper angle of a contact hole positioned at the central portion of the wafer was larger than the side wall taper angle of a contact hole positioned at the peripheral portion of the wafer. This means that a degree of etching anisotropy of a contact hole positioned at the central portion of the wafer is lower than that of a contact hole positioned at the peripheral portion of the wafer.

As the first cause for this, the shower electrode 3 has a temperature gradient. As shown in FIG. 1, the cooling plate 53 is in tight contact with the upper surface of the cathode plate 54 of the shower electrode 3, and the temperature of the shower electrode 3 is set at about 20° C. However, a space between the cooling plate 53 and the cooling block 23 is used as a header for supplying a process gas. For this reason, the cooling plate 53 is cooled structurally from its peripheral portion, and the temperature of the central portion of the cooling plate 53 is higher than that of the peripheral portion. That is, a temperature gradient defined such that a temperature at the peripheral portion of the shower electrode 3 is lower than a temperature at the central portion of the shower electrode 3 occurs in the shower electrode 3.

As described above, the center of the effective electrode portion EL of the shower electrode 3 substantially coincides with the center of the wafer W, and the temperature gradient of the shower electrode 3 coaxially influences the wafer W. As described above, when the temperature of the shower electrode 3 is high, a deposition amount of fluorocarbon-based polymer is increased. For this reason, the deposition amount of polymer is larger at the central portion than at the peripheral portion on the wafer W. This causes a degree of etching anisotropy of a contact hole positioned at the central portion of the wafer to be lower than that of a contact hole positioned at the peripheral portion of the wafer.

The temperature gradient of the shower electrode 3 cannot be easily eliminated structurally. This is because the space behind the shower electrode 3 is used as a header for supplying the process gas. Therefore, the present inventor performed various experiments to compensate for the influence of the temperature gradient by changing other factors influencing a degree of etching anisotropy. As a result, the present inventors have found out that, when the diameter of a region for forming the holes 55, i.e., the diameter of the shower region SR, is changed, the influence of the temperature gradient can be compensated for. In addition, the present inventors have also found out that, when the diameter of the effective electrode portion EL is changed, the taper angle of the side wall of each of the contact holes could be made close to 90°.

[Experiment]

An experiment which simulated a process of forming contact holes in an SiO₂ film on an Si wafer W was performed using a patterned photoresist film as a mask. Etching was performed using the apparatus shown in FIG. 1 under the conditions of Table 1 below. A 6-inch wafer was used as the wafer W, and a plurality of contact holes were formed in radial directions. An He gas was supplied as a heat medium gas into the space between the wafer W and the electrostatic chuck 64 (no supply line is shown in FIG. 1).

TABLE 1

| Pressure in Process Chamber | 250 mT |
| --- | --- |
| RF Power Supply Voltage | 800 W |
| Distance Between Electrodes | 10 mm |
| Process Gas Flow Rate | |
| CHF₃ | 20 SCCM |
| CF₄ | 20 SCCM |
| Ar | 400 SCCM |
| Set Shower Electrode Temperature | 20° C. |
| Set Susceptor Electrode Temperature | −10° C. |
| Set Process Chamber Side Walls Temperature | 40° C. |

Figure 7:
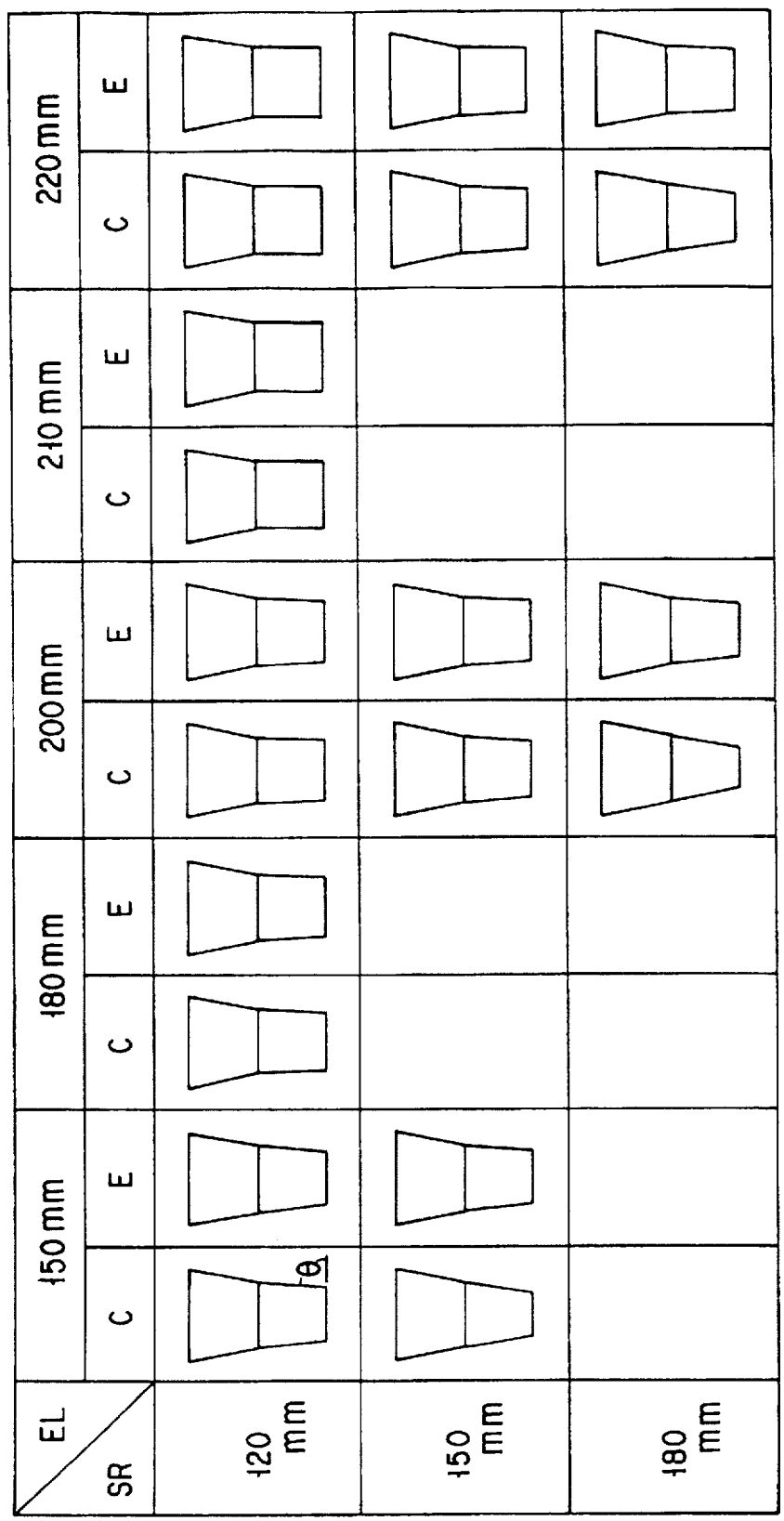
FIG. 7 is a table showing the relationships between the diameters of the effective electrode portion and shower region of the shower electrode and degrees of etching anisotropy.

FIG. 7 shows the relationship between the diameters of the effective electrode portion EL and the shower region SR obtained in the above experiment and the degrees of etching anisotropy. A plurality of inverse trapezoids shown in FIG. 7 illustrate several sectional photographs of the contact holes obtained under the diameters set out therein. The upper portion of each sectional shape indicates the hole portion of a photoresist corresponding to, e.g., the photoresist PR shown in FIG. 6. Therefore, a degree of etching anisotropy can be evaluated by the taper angle θ of the lower portion of the sectional shape, which corresponds to the side wall formed in the SiO₂ film. Referring to FIG. 7, each "C" indicates a contact hole at the central portion of the wafer, and each "E" indicates a peripheral contact hole positioned at the outermost portion of a usable range except for the marginal portion of the wafer.

As is apparent from FIG. 7, when the diameter of the shower region SR is 180 mm, i.e., larger than that of the wafer W, the side wall taper angle of a contact hole at the central portion is considerably larger than the side wall taper angle of a contact hole at the peripheral portion. This means that the degree of etching anisotropy of a contact hole at the central portion is smaller than that of a contact hole at the peripheral portion. When the diameter of the shower region SR is 150 mm, i.e., is close to the diameter of the wafer W, although the difference between the side wall taper angles at the central and peripheral portions is slightly decreased, this difference is still clear. In contrast to this, when the diameter of the shower region SR is 120 mm, i.e., is smaller than that of the wafer W, the difference between the side wall taper angles at the central and peripheral portions is rarely found. In other words, when SR diameter=120 mm, planar uniformity of a degree of etching anisotropy on the wafer W is improved.

The following has been found in a pursuing experiment. That is, in consideration of a normal temperature difference of 2° to 30° C. between the central and peripheral portions of the effective electrode portion EL while plasma is being generated, the diameter of the shower region SR is set to fall within a range smaller than the diameter of the wafer W by 5 to 25%, in order to control the difference between the side wall taper angles θ at the central and peripheral portions of the wafer to fall to an allowable degree less than 5°. That is, when the diameter of the shower region SR is controlled to fall within this range, planar uniformity of a degree of etching anisotropy on the wafer W can be kept relatively good. When the diameter of the shower region SR is larger than this range, a degree of etching anisotropy at the central portion of the wafer becomes considerably degraded compared with a degree of etching anisotropy at the peripheral portion of the wafer. In addition, when the diameter of the shower region SR is smaller than the range, the degree of etching anisotropy at the peripheral portion of the wafer becomes considerably degraded compared with the degree of etching anisotropy at the central portion of the wafer. More preferably, an SR diameter of 120 to 140 mm and an SR diameter of 160 to 180 mm are selected for a 6-inch wafer and an 8-inch wafer, respectively.

As is apparent from FIG. 7, as the diameter of the effective electrode portion EL is larger, the side wall taper angle of each contact hole comes closer to 90°. However, the EL diameter influences any other performance of the apparatus and also influences the size of the apparatus. Therefore, according to the present invention, the EL diameter is determined in consideration of the following several points.

FIGS. 8A to 8J are graphs showing the relationships between etch rates and the diameters of the effective electrode portion EL and the shower region SR obtained in the above experiment. Referring to FIGS. 8A to 8J, each broken line indicates the etch rate of each contact hole traversing the center of the orientation flat of the wafer in the first direction, and each solid line indicates the etch rate of each contact hole in the second direction perpendicular to the first direction.

Figure 8A:
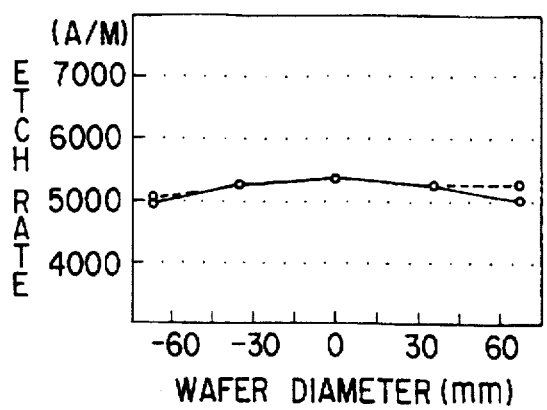
FIGS. 8A to 8J are graphs showing the relationships between etch rates and the diameters of the effective electrode portion and shower region of the shower electrode.
Figure 8D:
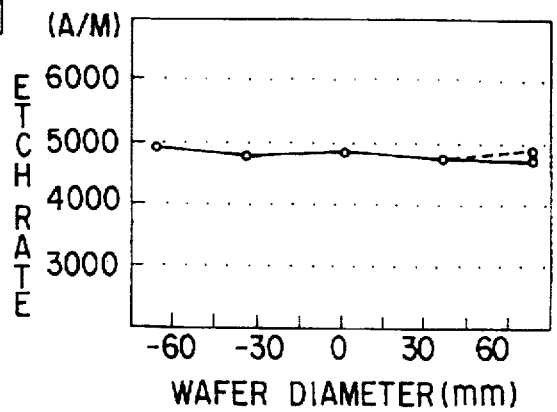
Figure 8B:
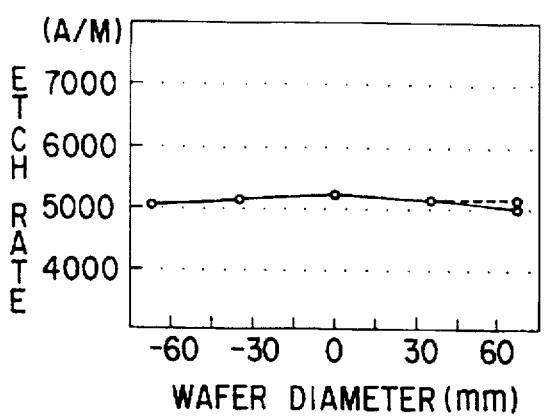
Figure 8E:
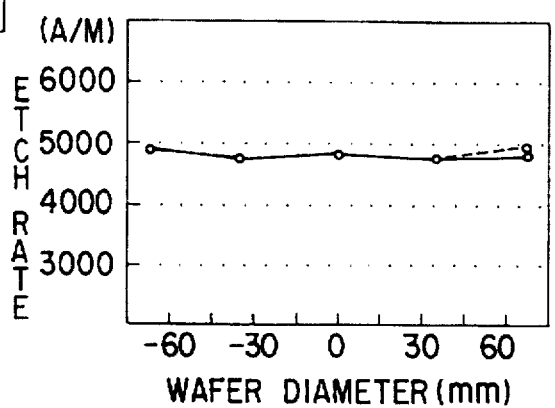
Figure 8C:
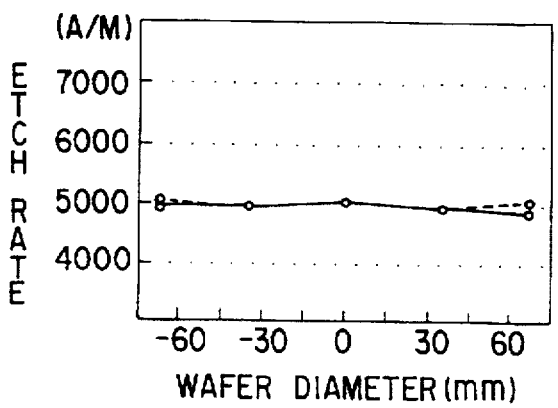
Figure 8F:
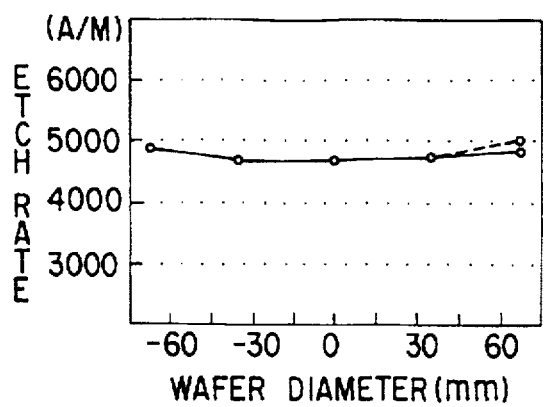
Figure 8I:
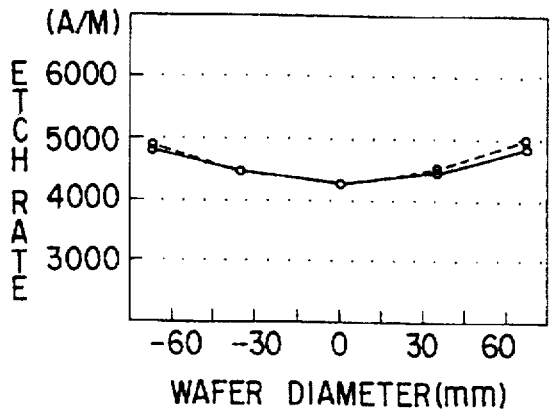
Figure 8G:
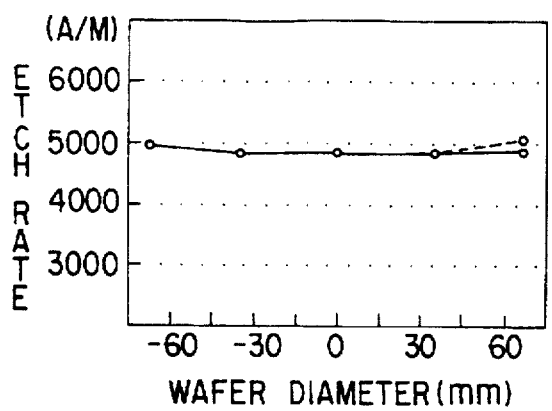
Figure 8J:
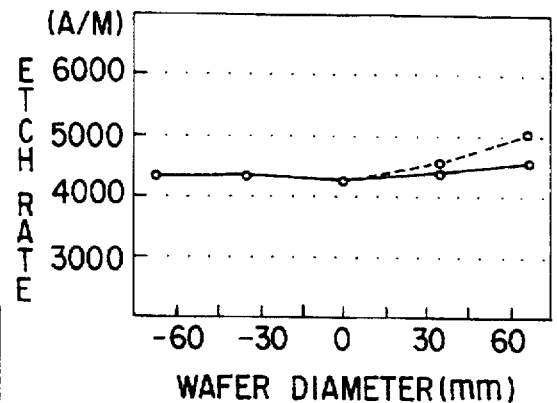
Figure 8H:
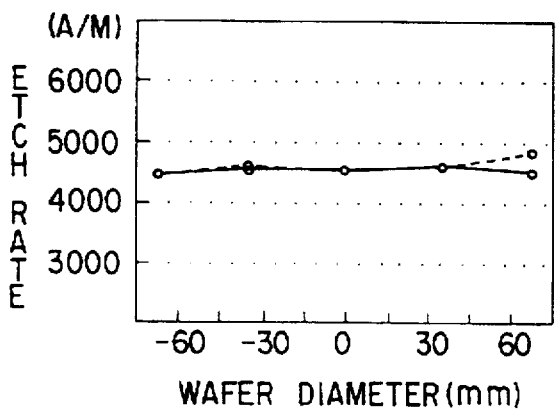

FIGS. 8A to 8E show cases wherein, when SR diameter= 120 mm, EL diameters are set to be 150, 180, 200, 210, and 220 mm, respectively. FIGS. 8F to 8H show cases wherein, when SR diameter=150 mm, EL diameters are set to be 150, 200, and 220 mm. FIGS. 8I and 8J show cases wherein, when SR diameter=180 mm, EL diameters are set to be 200 and 220 mm.

As is apparent from FIGS. 8A to 8J, as the EL diameter is increased, the planar uniformity of etch rates on the wafer W becomes excellent. However, when EL diameter=200 mm or more, this effect is almost saturated. In addition, as the EL diameter is larger, an etch rate is lower. Further, it is known that a selection ratio of $SiO_2$ to Si is decreased by increasing the EL diameter, as shown in U.S. Pat. No. 5,089,083 (issued on 1992, Feb. 18). By an experiment performed in consideration of the plurality of factors, it has been found that the EL diameter is set to fall within a range larger than the diameter of the wafer W by 5 to 35%, preferably by 10 to 20%, in order to perform etching having a high etch rate, a high selectivity ratio, and a high anisotropy with a side wall taper angle θ of 85° to 90°. However, the EL diameter larger than that of the wafer W by a degree greater than 0% and less than 100% can be used when these requirements are not so severe in practice.

A whole process in which, by using the apparatus shown in FIG. 1, contact holes are formed in the $SiO_2$ film on the Si wafer W using the patterned photoresist film as a mask will be described below. The contact holes are present at the central and peripheral portions of the wafer.

According to the present invention, the sizes of the shower region SR and the effective electrode portion EL are selected, and the apparatus is set on the basis of the sizes.

The size of the shower region SR is selected for which degradation of planar uniformity of a degree of etching anisotropy on the wafer caused by the temperature gradient of the effective electrode portion EL is compensated. That is, in the apparatus shown in FIG. 1, the diameter of the shower region SR is set to be a value falling within a range smaller than the diameter of the wafer W by 5 to 25% in consideration of the temperature difference of 2° to 30° C. during etching between the central portion and peripheral portion of the effective electrode portion EL whose temperature is initially set at about 20° C. The difference between the side wall taper angles θ at the central and peripheral portions of the wafer is controlled to fall to an allowable degree, i.e., smaller than 5°.

The size of the effective electrode portion EL is selected such that the side wall taper angle of each contact hole is set to be 85° to 90°. The EL diameter is controlled to fall within a range larger than the diameter of the wafer W by a degree less than 100%, preferably by 5 to 35%, more preferably by 10 to 25% another factor influenced by an etch rate, a selectivity ratio, and the size of the effective electrode portion EL.

A wafer is loaded into the apparatus set as described above through the opening 15 having the open gate 16. In this case, an $SiO_2$ film and a patterned photoresist film are formed on the Si wafer in advance. The wafer is transferred by the transfer arm (not shown) arranged in the load lock chamber 17. After the wafer is placed on the susceptor electrode 61, the gate 16 is closed.

When the wafer is placed on the susceptor electrode 61, the electrostatic chuck 64 is operated, and the wafer is fixed on the susceptor electrode 61. An He gas serving as a heat medium is supplied between the wafer and the electrostatic chuck 64. At this time, the center of the wafer on the susceptor electrode 61 is substantially matched with the centers of the shower region SR and the effective electrode portion EL. The process chamber 1 is set at a predetermined degree of vacuum by the vacuum pump 83.

The electrode unit 2 is moved downward by the operation of the vertical drive cylinder 21, and an interval between the shower electrode 3 and the susceptor electrode 61 is set. According to the present invention, the electrodes 3 and 61 have a small interval, i.e., the interval is set at a value, e.g., 10 mm, falling within a range of 8 to 15 mm. A gas mixture obtained by mixing Ar, $CF_4$, and $CHF_3$ is supplied from the holes 55 of the shower electrode 3 such that an Ar gas content is smaller than a conventional one. In this case, the process chamber 1 is continuously exhausted by the vacuum pump 83. For example, the pressure of the plasma generation region 59 is set to be about 1 mTorr, and the pressure of the exhaust region 68 is set to be about $10^{-1}$ mTorr.

In this state, an RF power of several hundred watts is applied from the RF power supply 12 across the shower electrode 3 and the susceptor electrode 61 to make the process gas into a plasma. This plasma etches the $SiO_2$ film in accordance with the pattern formed in the resist film to form contact holes. Since the sizes of the shower region SR and the effective electrode portion EL are set as described above, this etching has good planar uniformity of a degree of anisotropy on the wafer and side wall taper angles each of which is close to 90°. In addition, since the Ar content in the process gas mixture is smaller than a conventional one, a selectivity ratio of $SiO_2$ to Si is increased.

Unnecessary reaction products and an excessive process gas are guided to the exhaust region 68 through the exhaust holes 67 of the exhaust ring 66. At this time, the process chamber 1 is heated by the buried ceramic heater 14 to a temperature, e.g., 40° C., at which reaction products are not deposited. For this reason, no reaction products are deposited on the inner wall of the plasma generation region 59 of the process chamber 1.

Upon completion of etching, supply of the process gas is stopped, and the RF power supply 12 and the electrostatic chuck 64 are turned off. The process gas in the process chamber is substituted with an inert gas. When this substitution in the process chamber is achieved to some extent, the gate 16 is opened, and the wafer is unloaded by the transfer arm (not shown) in the load lock chamber 17. At this time, the electrode unit 2 is moved upward by the operation of the vertical drive cylinder 21, and the interval between the shower electrode 3 and the susceptor electrode 61 is made larger than that during the etching process. A next unprocessed wafer is loaded into the process chamber 1, and the above etching process is repeated.

In the above embodiment, the effective electrode portion and the shower region of the shower electrode are formed to have circular shapes so as to have the same outline as that of a wafer. However, when a target substrate is rectangular like an LCD substrate, the outlines of the effective electrode portion and the shower region have preferably rectangular shapes similar to the shape of the substrate. The centers of the effective electrode portion and the shower region are preferably aligned with the center of the target substrate. That is, the present invention can be applied to not only a circular semiconductor wafer but also a substrate, such as an LCD substrate, having another shape.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An anisotropic etching method using an electrode plate in a plasma etching apparatus including, a process chamber, a first electrode arranged in said process chamber, said first electrode having a support portion for supporting a substrate to be processed, a second electrode arranged in said process chamber and having said electrode plate detachably mounted, said electrode plate having an opposing portion opposite to said support portion of said first electrode, wherein a shower region defined by a plurality of holes is formed in said opposing portion, a power supply for applying an RF voltage across said first and second electrodes, exhausting means for exhausting said process chamber, supplying means for supplying a process gas into said process chamber such that the process gas is supplied onto said substrate supported by said first electrode through said holes of said shower region, and cooling means arranged on said second electrode at least behind said opposing portion, for cooling said second electrode, said method comprising the steps of:

selecting a size of said shower region;

setting said apparatus based on the selected size of said shower region;

placing said substrate on said support portion of said first electrode;

exhausting said process chamber;

supplying the process gas through the holes of said shower region;

applying an RF voltage from said power supply across said first and second electrodes to make the process gas into a plasma; and anisotropically etching said substrate using the plasma;

wherein said opposing portion of said electrode plate is cooled by said cooling means such that said opposing portion has a temperature gradient in which a temperature at a peripheral portion of said opposing portion is lower than a temperature at a central portion of said opposing portion by 2° to 30° C., and the size of said shower region is set to be smaller than a size of said substrate by 5% to 25% such that degradation of planar uniformity of a degree of etching anisotropy on said substrate caused by said temperature gradient of said opposing portion is compensated for.

2. The method according to claim 1, wherein a center of said shower region is aligned with a center of said substrate when said substrate is supported by said first electrode.

3. The method according to claim 1, wherein said electrode plate further comprises a marginal portion extending outward from said opposing portion in a radial direction, by which said electrode plate is detachably mounted, said marginal portion being arranged all around said opposing portion.

4. The method according to claim 3, wherein said marginal portion is covered with an insulating ring, when said electrode plate is arranged in said second electrode.

5. The method according to claim 1, wherein said shower region and said substrate have a similar outline.

6. The method according to claim 5, wherein said shower region is a circular region having a diameter of 120 mm to 140 mm, when said substrate is a 6-inch semiconductor wafer.

7. The method according to claim 5, wherein said shower region is a circular region having a diameter of 160 mm to 180 mm, when said substrate is a 8-inch semiconductor wafer.

8. The method according to claim 1, wherein said electrode plate is formed of amorphous carbon.

9. The method according to claim 1, wherein said cooling means comprises a cooling plate in contact with said electrode plate behind said opposing portion.

10. An anisotropic etching method using an electrode plate in a plasma etching apparatus including, a process chamber, a first electrode arranged in said process chamber, said first electrode having a support portion for supporting a substrate to be processed, a second electrode arranged in said process chamber and having said electrode plate detachably mounted, said electrode plate having an opposing portion opposite to said support portion of said first electrode, wherein a shower region defined by a plurality of holes is formed in said opposing portion, a power supply for applying an RF voltage across said first and second electrodes, exhausting means for exhausting said process chamber, supplying means for supplying a process gas into said process chamber such that the process gas is supplied onto said substrate supported by said first electrode through said holes of said shower region, and cooling means arranged on said second electrode at least behind said opposing portion, for cooling said electrode plate, said method comprising the steps of:

selecting a size of said shower region;

selecting a size of said opposing portion;

setting said apparatus based on the selected sizes of said shower region and opposing portion;

placing said substrate on said support portion of said first electrode;

exhausting said process chamber;

supplying the process gas through the holes of said shower region;

applying an RF voltage from said power supply across said first and second electrodes to make the process gas into a plasma; and anisotropically etching said substrate using the plasma;

wherein the size of said opposing portion is set to be larger than a size of said substrate by 5 to 35% such that a taper angle of a side wall formed by etching is set to be between 85° and 90°, and wherein said opposing portion is cooled by said cooling means such that it has a temperature gradient in which a temperature at a peripheral portion of said opposing portion is lower than a temperature at a central portion of said opposing portion, and the size of said shower region is set to be smaller than the size of said substrate by 5% to 25% such that degradation of planar uniformity of a degree of etching anisotropy on said substrate caused by said temperature gradient of said opposing portion is compensated for.

11. The method according to claim 10, wherein centers of said shower region and opposing portions are aligned with a center of said substrate when said substrate is supported by said first electrode.

12. The method according to claim 10, wherein said electrode plate further comprises a marginal portion extending outward from said opposing portion in a radial direction, by which said electrode plate is detachably mounted, said marginal portion being arranged all around said opposing portion.

13. The method according to claim 12, wherein said marginal portion is covered with an insulating ring, when said electrode plate is arranged in said second electrode.

14. The method according to claim 10, wherein said shower region and said substrate have a similar outline.

15. The method according to claim 12, wherein said shower region is a circular region having a diameter of 120 mm to 140 mm, when said substrate is a 6-inch semiconductor wafer.

16. The method according to claim 12, wherein said shower region is a circular region having a diameter of 160 mm to 180 mm, when said substrate is a 8-inch semiconductor wafer.

17. The method according to claim 10, wherein said electrode plate is formed of amorphous carbon.

18. The method according to claim 10, wherein said cooling means comprises a cooling plate in contact with said electrode plate behind said opposing portion.

19. The method according to claim 10, wherein the size of said opposing portion is set to be larger than the size of said substrate by 10% to 20%.

20. The method according to claim 10, wherein said substrate has a target layer consisting essentially of $SiO_2$, and said target layer is a target to be etched in said step of anisotropically etching said substrate using the plasma.

21. The method according to claim 20, wherein a contact hole is formed in said target layer in said step of anisotropically etching said substrate using the plasma.

22. The method according to claim 21, wherein said process gas produces a fluorocarbon-based polymer in said step of anisotropically etching said substrate using the plasma.

23. The method according to claim 10, wherein said temperature gradient is formed such that said temperature at said peripheral portion of said opposing portion is lower than said temperature at said central portion of said opposing portion by 2° to 30° C.

* * * * *

UNITED STATES PATENT AND TRADEMARK OFFICE
CERTIFICATE OF CORRECTION

PATENT NO. : 5,766,498
DATED : June 16, 1998
INVENTOR(S) : Masayuki KOJIMA et al.

It is certified that error appears in the above-identified patent and that said Letters Patent is hereby corrected as shown below:

On the Title page, Item [62], Related U.S. Application Data information is incorrect. It should be:

--Division of Ser. No. 473,777, Jun. 6, 1995, abandoned, which is a division of Ser. No. 154,566, Nov. 19, 1993, Pat. No. 5,445,709.--

Column 1, line 5, "Jun. 5, 1995" should read --Jun. 6, 1995--.

Signed and Sealed this

Sixteenth Day of February, 1999

Attest:

Attesting Officer

*Acting Commissioner of Patents and Trademarks*